United States Patent [19]

Malhi

[11] Patent Number: 4,829,017
[45] Date of Patent: May 9, 1989

[54] METHOD FOR LUBRICATING A HIGH CAPACITY DRAM CELL

[75] Inventor: Satwinder S. Malhi, Garland, Tex.

[73] Assignee: Texas Instruments Incorporated, Dallas, Tex.

[21] Appl. No.: 912,030

[22] Filed: Sep. 25, 1986

[51] Int. Cl.[4] .......................................... H01L 21/225
[52] U.S. Cl. ....................................... 437/47; 437/38; 437/48; 437/51; 437/52; 437/60; 437/203; 437/79; 437/919
[58] Field of Search ........................ 437/52, 919, 162; 357/23.6

[56] References Cited

U.S. PATENT DOCUMENTS

| | | | |
|---|---|---|---|
| 3,961,355 | 6/1976 | Abbas et al. | 357/49 |
| 4,003,036 | 1/1977 | Jenne | 340/173 |
| 4,017,885 | 4/1977 | Kendal et al. | 357/24 |

(List continued on next page.)

FOREIGN PATENT DOCUMENTS

| | | |
|---|---|---|
| 0066081 | 12/1982 | European Pat. Off. . |
| 0088451 | 9/1983 | European Pat. Off. . |
| 0108390 | 5/1984 | European Pat. Off. . |
| 167764 | 1/1986 | European Pat. Off. . |
| 176254 | 4/1986 | European Pat. Off. . |
| 186875 | 7/1986 | European Pat. Off. . |
| 2706155 | 8/1978 | Fed. Rep. of Germany . |
| 3508996 | 10/1985 | Fed. Rep. of Germany . |
| 3525418 | 1/1986 | Fed. Rep. of Germany . |
| 130178 | 12/1976 | Japan . |
| 0010973 | 1/1982 | Japan . |
| 109367 | 7/1982 | Japan . |
| 0010861 | 1/1983 | Japan . |
| 3269 | 1/1983 | Japan . |
| 141262 | 2/1983 | Japan . |
| 0204568 | 11/1983 | Japan . |
| 213464 | 12/1983 | Japan . |
| 0103373 | 1/1984 | Japan . |
| 0019366 | 1/1984 | Japan . |
| 12752 | 1/1985 | Japan .................... 437/52 |
| 0182161 | 9/1985 | Japan . |
| 261165 | 12/1985 | Japan . |
| 36965 | 2/1986 | Japan . |
| 73366 | 4/1986 | Japan . |
| 198590 | 11/1986 | Japan . |
| 1084937 | 9/1967 | United Kingdom . |
| 2002958 | 2/1979 | United Kingdom . |
| 2168195 | 12/1985 | United Kingdom . |

OTHER PUBLICATIONS

Lee et al., IBM TDB, vol. 22, No. 8B, Jan. 80, pp. 3630–3634.

Fatula et al., IBM TDB, vol. 22, No. 8A Jan. 1980, pp. 3204–3205.

Chang et al., IBM TDB, vol. 22, No. 7, Dec. 79, pp. 2768–2771.

Kenney IBM TDB, vol. 23, No. 3, Aug. 80, pp. 967–969.

(List continued on next page.)

*Primary Examiner*—Brian E. Hearn
*Assistant Examiner*—Tom Thomas
*Attorney, Agent, or Firm*—Douglas A. Sorensen; Melvin Sharp; James T. Comfort

[57] ABSTRACT

A dynamic random access memory cell (14) is disclosed which is characterized by a high capacity storage element and small lateral wafer area. The cell (14) is constructed with a word line (40) overlying a split bit line (48, 50), with an underlying transistor 30, and yet thereunder a high capacitance capacitor (34). The word line (40) includes a member (42) isolated from the bit line (36) and formed therethrough to provide the transistor gate conductor. The transistor gate insulator (44) covers the gate conductor (42), and is encircled by a transistor semiconductor region (46) forming a vertical transistor conduction channel. The split bit line elements (48, 50) are in electrical contact with an underlying transistor drain region (126). The transistor conduction channel (46) is also in contact with an underlying transistor source region forming one plate (52) of the capacitor (34). The capacitor plate (52) is a core which is enclosed annularly by dielectric isolation (54). Another semiconductor capacitor plate (56) encircles the dielectric isolation (54).

5 Claims, 4 Drawing Sheets

U.S. PATENT DOCUMENTS

| | | |
|---|---|---|
| 4,105,475 | 8/1978 | Jenne .................................. 437/52 |
| 4,115,795 | 9/1978 | Matsuoka et al. ................. 357/24 |
| 4,116,720 | 9/1978 | Vinson ................................ 437/38 |
| 4,164,751 | 8/1979 | Tasch, Jr. ........................... 357/41 |
| 4,199,772 | 4/1980 | Natori et al. ....................... 357/23 |
| 4,225,945 | 9/1980 | Kuo .................................... 365/149 |
| 4,252,579 | 2/1981 | Ho et al. ........................ 437/52 X |
| 4,262,296 | 4/1981 | Shealy et al. ..................... 357/55 |
| 4,319,342 | 3/1982 | Scheuerlein ...................... 365/149 |
| 4,327,476 | 5/1982 | Iwai et al. ......................... 437/38 |
| 4,353,086 | 10/1982 | Jaccodine et al. ................ 357/51 |
| 4,364,074 | 12/1982 | Garnache et al. ................ 357/23 |
| 4,369,564 | 1/1983 | Hiltpold ....................... 437/52 X |
| 4,397,075 | 8/1983 | Fatula, Jr. et al. .......... 437/52 X |
| 4,412,237 | 10/1983 | Matsummura ................... 357/42 |
| 4,432,006 | 2/1984 | Takei ................................. 357/23 |
| 4,434,433 | 2/1984 | Nishizawa ........................ 357/22 |
| 4,462,040 | 7/1984 | Ho et al. ........................... 357/23 |
| 4,472,240 | 9/1984 | Kameyama ...................... 156/648 |
| 4,476,623 | 10/1984 | El-Karah .......................... 437/52 |
| 4,536,785 | 8/1985 | Gibbons ............................ 357/54 |
| 4,568,958 | 2/1986 | Baliga ............................... 357/23.4 |
| 4,630,088 | 12/1986 | Ogura et al. ...................... 357/23.6 |
| 4,636,281 | 1/1987 | Buiguez et al. .................. 156/643 |
| 4,649,625 | 3/1987 | Lu ................................. 437/919 X |
| 4,650,544 | 3/1987 | Erb et al. ...................... 437/919 X |
| 4,651,184 | 3/1987 | Malhi ................................ 357/23.6 |
| 4,670,768 | 6/1987 | Sunami et al. ................... 357/42 |
| 4,672,410 | 6/1987 | Miura et al. ...................... 357/23.6 |
| 4,673,962 | 6/1987 | Chatterjee et al. ............... 357/23.6 |
| 4,683,486 | 7/1987 | Chatterjee ........................ 357/23.6 |
| 4,702,795 | 10/1987 | Douglas ........................ 437/919 X |
| 4,704,368 | 11/1987 | Goth et al. .................... 437/919 X |
| 4,717,942 | 1/1988 | Nakamura et al. ............... 357/23.6 |
| 4,751,557 | 1/1988 | Sunami et al. ................... 357/23.6 |
| 4,751,558 | 6/1988 | Kenney ............................. 357/23.6 |

OTHER PUBLICATIONS

Barson, IBM TDB, vol. 21, No. 7, Dec. 78, pp. 2755–2756.

Chang et al., IBM Technical Disclosure Bulletin, vol. 22, No. 8B, Jan. 1980, pp. 3683–3687.

Jambotkar, "Compact One-Device Dynamic RAM Cell with High Storage Capacitance", IBM TDB, Jul. 1984, pp. 1313–1320.

Clarke et al., IBM TDB, vol. 17, No. 19, Feb. 1975, pp. 2579–2580.

Kenney, IBM TDB, vol. 23, No. 9, Feb. 81, pp. 4052–4053.

METHOD FOR LUBRICATING A HIGH CAPACITY DRAM CELL

RELATED APPLICATION

"DRAM Cell and Method" but Satwinder S. Malhi and Gordon P. Pollack, Ser. No. 666,715, filed Oct. 31, 1984.

TECHNICAL FIELD OF THE INVENTION

The present invention relates in general to semiconductor memory devices, and more particularly relates to dynamic random access memory cells of the single transistor type.

BACKGROUND OF THE INVENTION

Advancements in semiconductor technology have made possible memory chips with over a million locations for storing bits of data information. While each generation of memory chips at least doubles the number of storage locations, the size of the integrated circuit chips must yet be maintained within certain limits to enhance production yield and accommodate conventional packaging schemes.

A majority of dynamic random access memories (DRAMs) are fabricated using the metal oxide silicon field effect transistor (MOSFET) technology, and therefore the circuits can be reduced in area simply by scaling to a smaller dimension. That is, all dimensions of the various process masks are uniformly shrunk so that the resulting circuitry can be fabricated in a smaller area on the wafer. The scaling of a MOSFET circuit is effective to reduce the wafer area accommodated by a circuit, within certain limits. One limitation in scaling an integrated circuit is the photolithographic techniques used to form and maintain registration of the various masks.

Another limitation which is especially important in fabricating smaller area DRAM cells is that the capacitance of the storage capacitor must be of at least a specified value. With sufficient capacitance, a charge can be stored in the capacitor, and later recovered as a signal of significant magnitude to be detectable over noise and other electrical interference. Also, the capacitance of the storage capacitor must be of such a value so that memory refresh cycle times do not become appreciable in comparison to the normal read and write operations of the memory.

Various approaches have been taken to reduce the cell size of DRAMs without comprising the storage capacity of the capacitor. One approach commonly taken in the art to conserve semiconductor wafer area is to form the capacitor storage element under the surface-fabricated transistor of the cell. This is accomplished by forming a V-groove in the surface of the substrate, forming the cell transistor in the inclined face of the V-groove, and the capacitor thereunder. This type of device is commonly referred to as a V-MOS device. While the V-groove type of device is effective in conserving substrate space, difficulties are encountered in masking and fabricating the irregular contour of the V-groove device.

A problem attendant with the placing of a large number of semiconductor devices in a small area is the erroneous operation thereof due to electron and hole charge generation caused by alpha particles entering the wafer. With a close spacing between adjacent circuits, the electron or hole charge generated in one circuit by an alpha particle can be transferred to an adjacent circuit and create the potential of erroneous operation. When this occurs, the neighboring cells are momentarily connected together, resulting in the possible loss of information. Alpha particle interference is particularly disruptive of operations in logic circuits, and especially in DRAM cells when the small storage capacitors can be quickly discharged by the addition of holes or electrons to the charged capacitor plates.

From the foregoing, it can be seen that a need exists for a dynamic random access memory device which requires very little substrate space, but which does not sacrifice capacitance storage capabilities. A concomitant need exists for a DRAM cell which is more resistant to alpha particle problems, and which can be easily and economically fabricated using current process techniques.

SUMMARY OF THE INVENTION

In accordance with the present invention, an improved DRAM device and method of fabrication thereof is disclosed which reduces or eliminates disadvantages and shortcomings associated with the prior art methods and devices. According to the invention, both a transistor and a capacitor element of a DRAM cell are fabricated transverse to the face of the wafer, thereby providing a highly compact memory cell.

According to the preferred embodiment of the invention, an epitaxial layer is deposited on the substrate, and an annular or circumferential trench is formed therein. The epitaxial region forming the opposing sidewalls of the trench is heavily doped by a diffusion process. The doped region outside of the annular trench forms semiconductor capacitor regions for four adjacent cells, while the doped region encircled by the trench forms a core plate of the cell capacitor described herein. The sidewalls of the annular trench are then oxidized to form a thin insulator comprising a capacitor dielectric. The annular trench is then coated with a protective polycrystalline silicon. The annular trench is formed deeper down into the substrate, and is filled with polycrystalline silicon of the opposite conductivity type as that of the capacitor core plate. The polycrystalline silicon filled trench forms the outer circumferential plate of the capacitor which is shared as the outer plates of the capacitors of the neighboring cells. The circumferential capacitor plate is also in electrical contact with the substrate which is maintained at a ground potential to electrically isolate each cell on the wafer.

The lightly doped silicon part of the epitaxial layer located over the diffused capacitor core plate provides a semiconductor region for the cell transistor. Deposited and patterned in a location overlying the transistor region is a heavily doped layer of conductive polysilicon forming the bit line strip of the memory array. A shallow trench or cavity is etched through an opening in the bit line strip and through the epitaxial transistor layer into the underlying diffused capacitor core plate. The processed wafer is subjected to a wet etch which removes a portion of the previously formed surface silicon dioxide thereby forming an undercut in the cavity sidewall. A layer of polycrystalline silicon is conformally deposited over the surface of the substrate and into the transistor cavity. Polysilicon is also deposited into the undercut portion formed by the lateral etching of the oxide. The temperature of the substrate is then elevated in an oxygen ambient, thereby oxidizing a portion of the conformal polysilicon to form a thin insulating layer defining the gate insulator of the cell transistor. The elevated temperature also drives the impurities from the doped bit line into the polysilicon deposited in the undercut portion, thereby forming the semiconductor source region of the transistor.

Additional conductive polysilicon is deposited over the surface of the processed wafer sufficiently to fill the transistor cavity. The polysilicon is patterned to form the word line of the memory array. The conductive polysilicon filling the transistor cavity provides the gate conductor of the transistor.

The transistor-capacitor cell is thus formed with cavity oxide surrounding the gate conductor, and with the vertically oriented transistor source and drain regions circumscribing the gate oxide. The initially deposited epitaxial material overlying the capacitor core plate and circumscribing the gate oxide forms the transistor conduction channel separating the source and drain region. A technical advantage is achieved wherein the upper transistor source serves as both the bit line and the transistor active region. The lower transistor active drain region also serves as the capacitor core plate.

A memory cell thus constructed conserves substrate area by forming a large area capacitor plate under the transistor, and by forming the transistor vertically along the oxide sidewalls of the transistor cavity. The capacitance of the cell capacitor is maintained large by forming it deep into the substrate, rather than laterally, and forming it surrounded by an oxide dielectric and an outer peripheral plate. The outer peripheral capacitor plate is of the same conductivity type as the substrate, and is shared as a plate with four neighboring cell capacitors. A significant technical advantage of the cell construction of the invention is that the dielectric shell of the capacitor isolates both the cell transistor and the capacitor core plate from neighboring cells, thereby reducing erroneous operation due to electrons and holes generated by alpha particle strikes in neighboring cells.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts throughout the views, and in which.

DETAILED DESCRIPTION OF THE INVENTION

Figure 1:
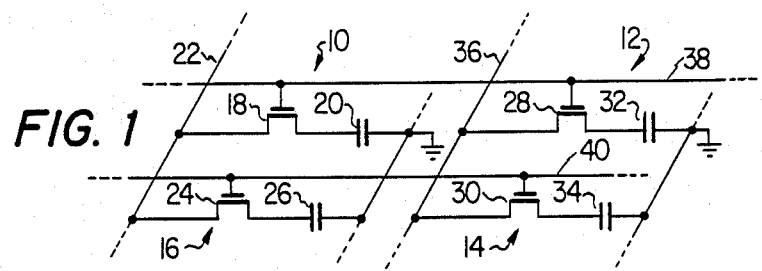
FIG. 1 is a schematic diagram illustrating four dynamic memory cells of a conventional DRAM array.

FIG. 1 is a schematic diagram of four memory cells 10, 12, 14 and 16 of a conventional dynamic random access memory array. The memory cells are of the one transistor type, including for example, in cell 10, a transistor 18 for switchably connecting an associated storage capacitor 20 to a bit line 22. The bit line 22 is sometimes referred to as the column line of the memory. A number of similar transistors of other cells, such as cell 16 with transistor 24 and capacitor 26, are also connected to the bit line 22. Each transistor 18 and 24 is operative to couple a charge to or from the bit line 22 to its associated capacitor. The memory cell capacitors constitute the storage element for dynamically storing a charge corresponding to digital information on the bit line. Transistors 28 and 30, and associated storage capacitors 32 and 34 are comparably connected to a second bit line 36. Of course, a typical memory array would include more cells than shown connected to the bit lines, and more bit lines.

Transistor 28 of cell 12 and transistor 30 of cell 14 are each connected to the bit line 36, and are individually selectable by corresponding word lines 38 and 40. By addressing the desired word line 38 or 40 during a memory write operation, the respective transistor 28 or 30 are driven into conduction to transfer the charge from the bit line 36 to the associated capacitor 32 or 34. Thus, when a digital one or zero signal appears on the bit line 36, one of the transistors 28 or 30 connected to the bit line 36 will be driven into conduction to thereby store a representative charge in the selected capacitor 32 or 34. It should be understood that a typical dynamic random access memory chip may include over a million such cells. Word lines 38 and 40 are also shown connected to memory cell transistors 18 and 24 for selectively coupling charge to or from the bit line 22 to the respective storage capacitors 20 and 26.

With a corresponding large number of bit lines and word lines, each cell of the entire array can be addressed. Each cell can be selectively accessed by activating the bit line and the word line which intersects at the desired cell. Write operations are conducted by driving a bit line 36 with the desired logic one or zero, and simultaneously driving a word line 40 so that the intersecting cell transistor 30 conducts and the cell capacitor 34 thus becomes charged with the logic one or zero charge. The accessed cell 14 is read by driving the selected cell transistor 30 into conduction, and sensing the charge discharged from the capacitor 34 on the selected bit line 36. It can be appreciated that despite the small number of components required to form a memory cell 14, a considerable amount of substrate space is required when fabricating a memory having over a million such cells.

Figure 2:
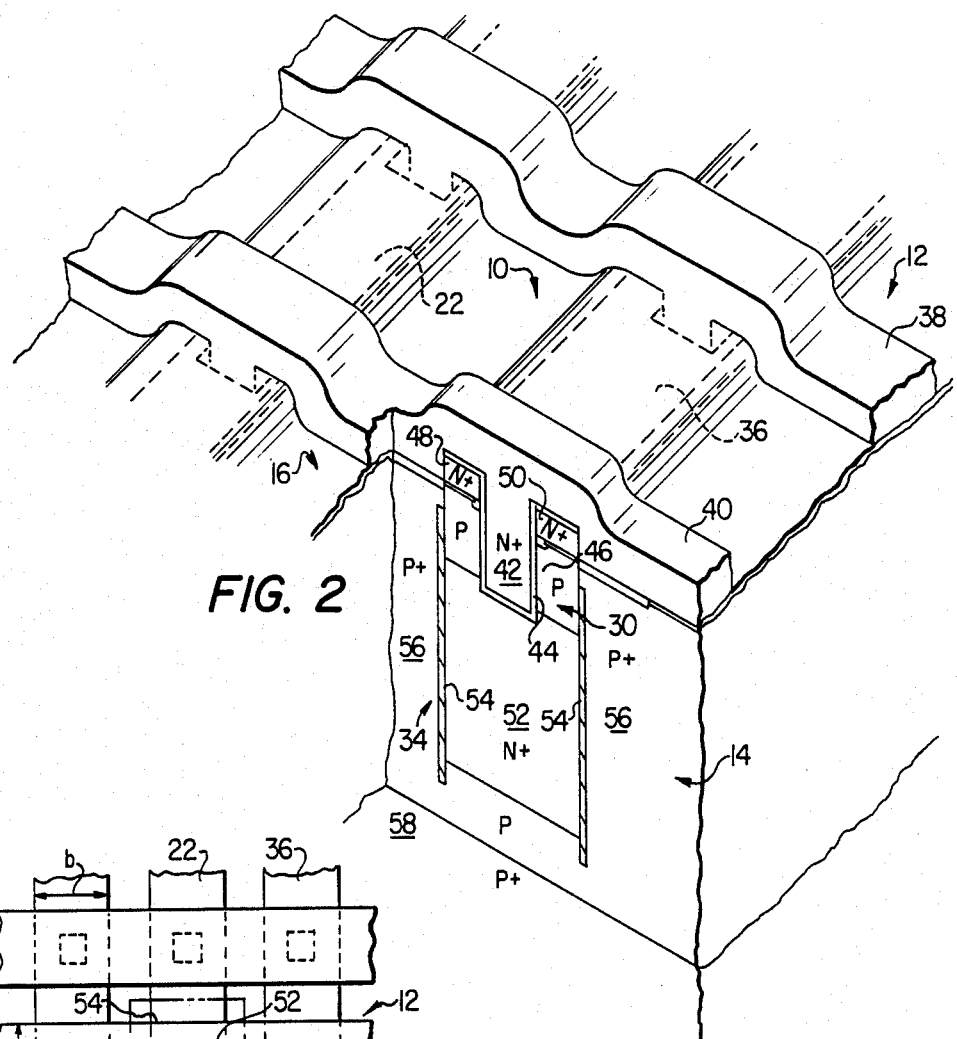
FIG. 2 is an oblique cross-sectional view of a DRAM cell constructed in accordance with the invention.

FIG. 2 illustrates a sectional view of a one transistor cell of the array corresponding to FIG. 1, and fabricated in accordance with the principles and concepts of the invention, with like numbers used for like and corresponding parts. Memory cell 14 is shown connected by a word line 40 which is also common to the neighboring cell 16. Memory cell 14 is shown connected to a split bit line 36 which is also shared by a different neighboring memory cell 12. In like manner, the fourth memory cell 10 of the illustrated array is connected by the word line 38 in common with cell 12, and by the bit line 22 which is in common with cell 16.

Memory cell 14 includes an insulated gate FET transistor 30 fabricated in part with the word line 40 which forms the gate conductor 42 thereof. A thin oxide insulation 44 forms the insulator separating the transistor gate conductor 42 from the transistor conduction channel 46. Sections 48 and 50 of the split bit line 36 form the drain region of the transistor 14. A heavily doped semiconductor region 52, termed a core plate, forms the source region of the transistor 14, as well as one plate of the capacitor 34. A thin capacitor dielectric 54 separates the semiconductor capacitor core plate 52 from a second semiconductor region 56 which forms an outer annular or circumferential capacitor plate. In the preferred form of the invention, the capacitor core plate 52 is doped with an N-type impurity, and the outer plate 56 is of the opposite conductivity type. While capacitor core plate 52 also forms the source of the transistor 14, the outer capacitor plate 56 also forms the plate of the other neighboring capacitors. The outer capacitor plate 56 is electrically connected to the substrate 58 of the chip. The substrate 58 is connected to a voltage potential, such as ground, which is effective to electrically isolate the memory cell 14 from the neighboring memory cells. The remaining storage cells 10, 12 and 16 are similarly constructed.

In operation, when it is desired to store a charge, representative of a digital voltage on the bit line 36, in the cell capacitor 34, the transistor 14 is made conductive by applying a positive voltage to the word line 40. As a result, charge, or the absence thereof, on the bit line 36 is conducted from the transistor drain region sections 48 and 50 to the source region 52, and thus stored in the capacitor 34. The read operation of the memory cell 14 is accomplished by again applying a voltage to the word line 40 to render the transistor 14 conductive, thereby transferring any charge previously stored in the capacitor 34, onto the bit line 36. Sense amplifier circuits (not shown) are effective during read operations to sense the presence or absence of charge on the bit line 36, and thus ascertain whether a logic one or zero has been read from the cell capacitor 34.

Figure 3:
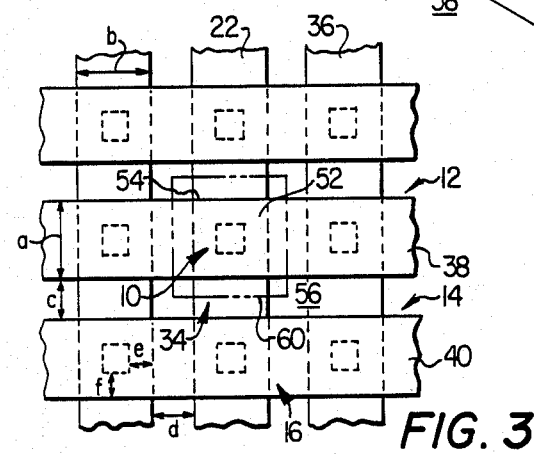
FIG. 3 is a top view of a nine cell DRAM array of the invention illustrating the cell geometry which provides a large cell capacitance with a small wafer area.

FIG. 3 is a top view of a memory array illustrating nine cells constructed according to the invention. Bit lines 22 and 36 intersect with word lines 38 and 40, as previously described. While the cells are shown generally in rectangular shape, other cell shapes may be equally desirable. The capacitor 34 of memory cell 10 includes a central core plate 52 of semiconductor material. The capacitor dielectric 54 separates the central capacitor core plate 52 from the outlying annular semiconductor region 56 forming the other plate. The annular capacitor plate 56 totally encircles the capacitor core plate 42, and is insulated therefrom by the dielectric 54. While the broken line 60 illustrates the general boundary of the cell 10, it is to be understood that the boundary is arbitrary, as all the semiconductor material in the array outside all the cell dielectrics is formed at the same time. The outer plates of all the cell capacitors are formed in common with the substrate which, in the preferred embodiment, is grounded. The geometrical configuration of the memory cell 10 provides an increased amount of capacitance, without requiring a substantial amount of lateral wafer area. This presents technical advantages over memory cell capacitors known in the art, as the present invention provides a three dimensional storage area with increased capacitor plate area which extends both down into the substrate, and laterally in an enclosed manner. Additional wafer area is saved by forming each cell transistor in a location generally underlying the intersection of a bit line and a word line.

With two micron wide word lines and bit lines, and one micron separation therebetween, and with one micron separation between cell dielectrics, the cell area defined by the broken line 60 can yet be as small as nine square microns. Also, the circumference of the capacitor core plate defined by the thin dielectric insulator 54 can yet be as large as eight microns. The cell 10 of the array of FIG. 3 achieves this large capacitance to wafer area ratio when the following dimensions are met: a=b=2 micron, c=d=1 micron, and e=f=0.5 microns. Semiconductor fabrication techniques are currently available for processing devices with these dimensions.

The fabrication steps of the memory cell 14 are shown sequentially in FIGS. 4–14. A silicon semiconductor substrate 58 is used as a basis for forming thereon the entire memory array. The substrate 58 can be on the order of about 500 microns thick, and heavily doped with a P-type impurity. The P+ substrate 58 is common to all the cells of the exemplary memory, and is connected to a voltage supply of magnitude sufficient to reverse bias the diodes formed by the P+ substrate material, and the N-type semiconductor material forming elements of the cells.

Figure 4:
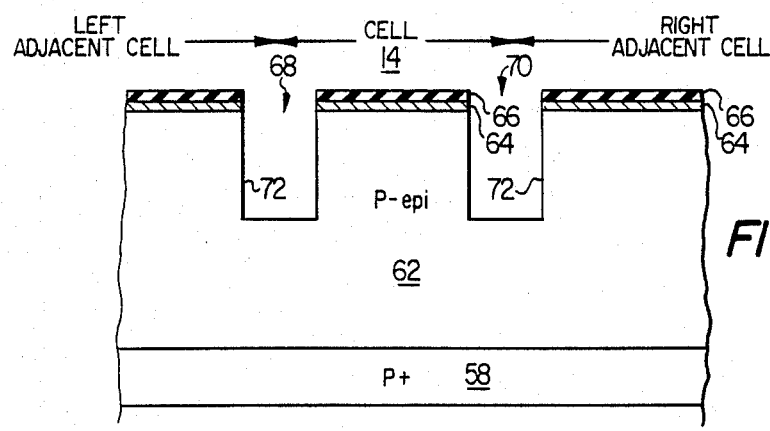
FIGS. 4–14 are cross-sectional views taken of the DRAM cell of the invention during various steps of the fabrication process.

As shown in FIG. 4, a doped epitaxial layer 62 is deposited on the substrate 58, with a depth of about eight to ten microns. As can be seen, the illustrations of the invention are not drawn to scale, but rather are drawn to clearly depict the details of the invention. The epitaxial layer 62 forms the semiconductor material in which the transistor 30 and capacitor 34 of the memory cell 14 are fabricated. The epitaxial layer 62 is doped with a P-type impurity, such as boron, and at a concentration to provide a resistivity of about 10–15 ohms per square centimeter. The epitaxial semiconductor material 62 is then oxidized to form a surface layer 64 of silicon dioxide having a thickness of about one micron. A layer 66 of photoresist material is spread over the surface of the oxide insulation layer 64 and patterned to define an annular trench opening, which appears in the sectional view as trench openings 68 and 70 in FIG. 4. In the memory cell area of the wafer, the annular trenches around each cell are common with neighboring cells, and form a lattice network (FIG. 3). As will be described in more detail below, a lateral square cavity will be formed between the openings 68 and 70 (in the center of the annular trench) into the epitaxial layer 62, and filled with a semiconductor material to form the gate conductor of the cell transistor 30.

Continuing with the fabrication process, the processed wafer or slice is subjected to a first etch which removes the layer 64 of insulation oxide exposed through the trench openings 68 and 70. The processed wafer is then subjected to a second etch of the dry type such as available with plasma techniques using HCl. A shallow annular trench 72 is etched to a depth of about two microns, and with a width of about one micron. FIGURE 4 illustrates a processed wafer after the trench 72 has been etched into the epitaxial layer 62. Because of its annular nature, trench 72 appears in cross section as two spaced apart trenches.

Figure 5:
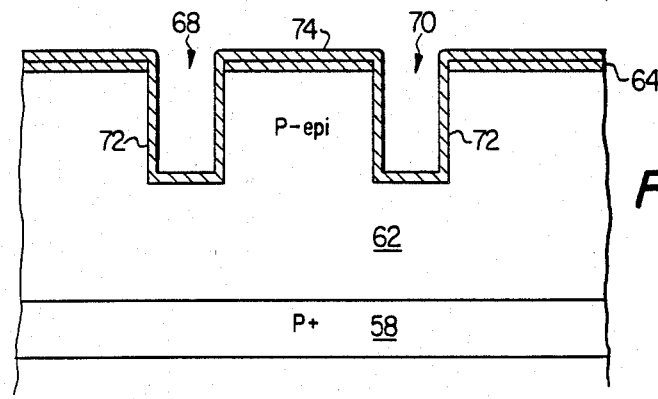

The photoresist mask layer 66 is removed by an oxygen plasma, and a layer 74 of silicon dioxide is deposited over the wafer, as shown in FIG. 5. The deposited silicon dioxide layer 74 is conformal, thereby covering the top surface of the wafer, and all surfaces of the trench 72. The conformal silicon dioxide layer 74 may be 700–800 Angstroms thick. The processed wafer is again subjected to a dry oxide etch of the type which is effective only in the vertical direction, as is well known in the art, and is effective to remove the surface oxide layer to a depth equal as initially deposited.

Figure 6:
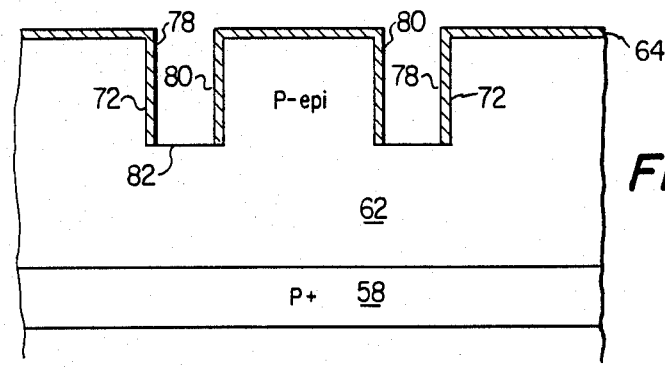

FIG. 6 illustrates the processed wafer after the oxide etch has been completed to the desired depth. As noted, the only oxide of the second oxide formation which remains is that which was deposited on the sidewalls of the trench 72. The sidewall oxide 78 covers the outside perimeter of the trench sidewall, while oxide layer 80 covers the inside perimeter of the trench sidewall. While the figures are not drawn to scale, it should be noted that the sidewall oxide 80 is associated with cell 14, while the sidewall oxide 78 is associated with two diemetrically located neighboring cells. Importantly, the only exposed part of the epitaxial layer 62 is that part which forms the bottom 82 of the trench 72.

Figure 7:
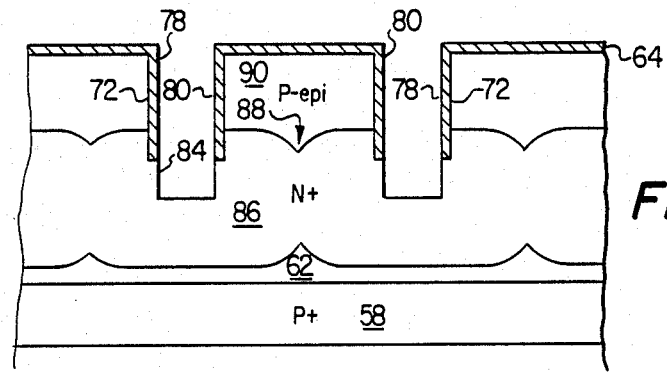
Figure 8:
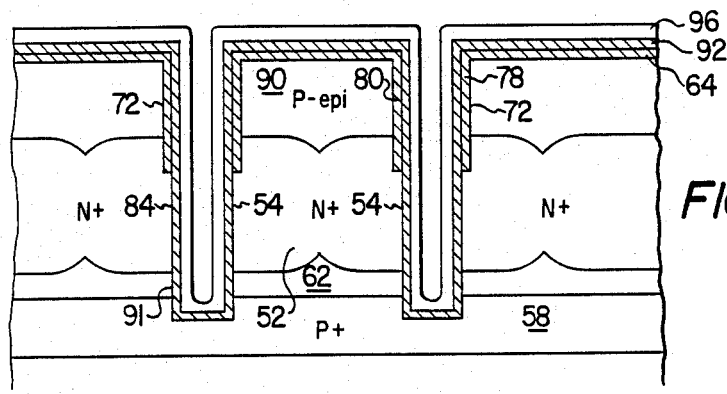

The processing wafer is again subjected to a dry silicon plasma etch which forms a deep trench extension 84 further into the epitaxial layer 62. This is illustrated in FIG. 7 of the drawings. The resultant depth of the trench is about 7-8 microns. A heavy concentration of an N-type impurity is then diffused into the epitaxial layer 62, transforming an area 86 from a P-type semiconductor material to an N-type semiconductor material. The N-type semiconductor area 86 is toroidal in shape with respect to cell 14, with the center thereof coming together at point 88. Although not essential to the fabrication or operation of the invention, the N-type semiconductor area 86 is shown diffused together at the middle, thereby separating the epitaxial layer into an isolated upper region 90 and the lower region 62. The N-type diffusion area 86 forms the capacitor core plates 52 of other cells of the memory array. As will be described below, the trench will be formed deeper and filled with doped polysilicon to form the circumferential capacitor plate 56 (FIG. 2).

The isolated island 90 of P-type epitaxial material will form a substrate in which the memory cell transistor 30 will be fabricated. As can be seen, the silicon dioxide layers 78 and 80 deposited on the shallow trench sidewalls form a mask to prevent the diffusion of the N-type impurity into the upper isolated epitaxial region 90. The resultant semiconductor structure appears as shown in FIG. 7.

The deep trench 84 is again etched by a dry process, to extend it downwardly, completely through the epitaxial layer 62 and partially into the P+ substrate 58. The third trench extension 91 is noted in FIG. 8 of the drawings. This third trench etch is also anisotropic in nature, and thus extends the second trench 84 only in a downward direction.

An additional layer 92 of silicon dioxide is deposited conformally over the surface of the wafer. This layer 92 of silicon dioxide forms the dielectric 54 which separates the N+ capacitor core plate 52 from the subsequently formed outer capacitor plate 56. The capacitance of the cell capacitor 34 is optimized by utilizing a thin dielectric 54, and in the present case a silicon dioxide thickness of about 200 angstroms. The capacitor dielectric oxide layer 92 must be of a high quality, e.g., free of imperfections such as pin holes. In order to protect the capacitor dielectric oxide layer 92, a layer 96 of polycrystalline silicon is deposited over the surface of the wafer. The polysilicon 96 includes a P-type dopant and is deposited by a low pressure chemical vapor deposition process, preferably at around 600° Celsius. The polysilicon layer 96 is deposited to a thickness of about 1,000 angstroms.

Figure 9:
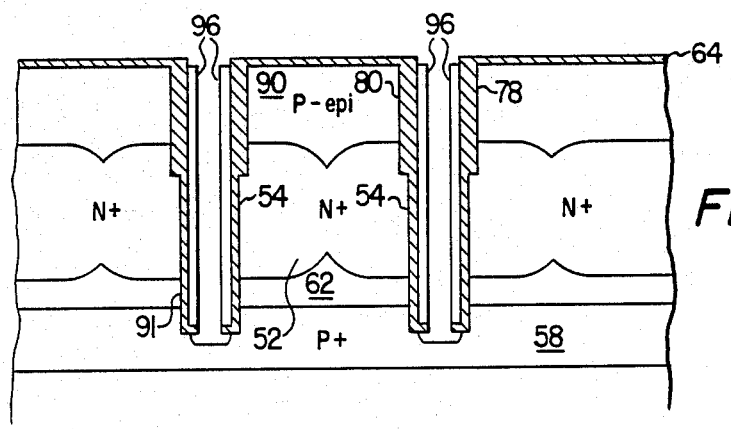

The wafer is next subjected to an etching process in which the polysilicon 96 is removed only in the vertical direction. As a result, the polysilicon layer 96 deposited on the top surface of the wafer, and that deposited on the bottom of the trench 91 is removed. The only remaining polysilicon is that which exists on the inner and outer peripheral sidewalls of the deep trench, thereby protecting the capacitor dielectric oxide layer 54. The silicon dioxide layer 92 is orientation dependent etched in the vertical direction, thereby also removing a portion of the silicon dioxide covering the top of the wafer, and that which was formed on the bottom of the trench 91. FIG. 9 illustrates the resultant structure of the wafer after the polysilicon etch and the silicon dioxide etch. Importantly, the trench 91 has been formed down into the P+ substrate 58.

Figure 10:
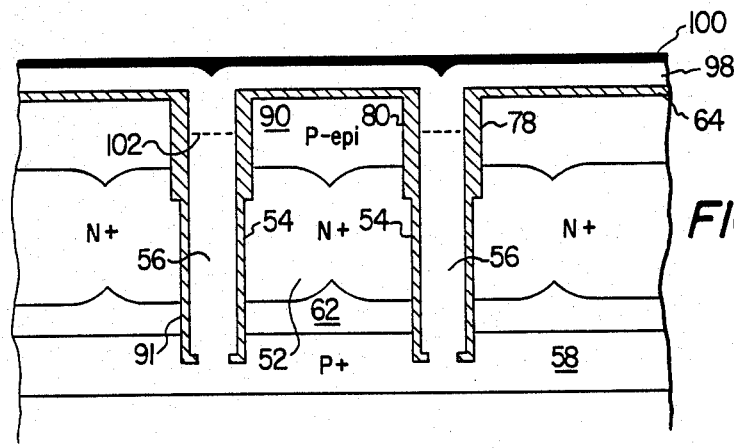
Figure 13:
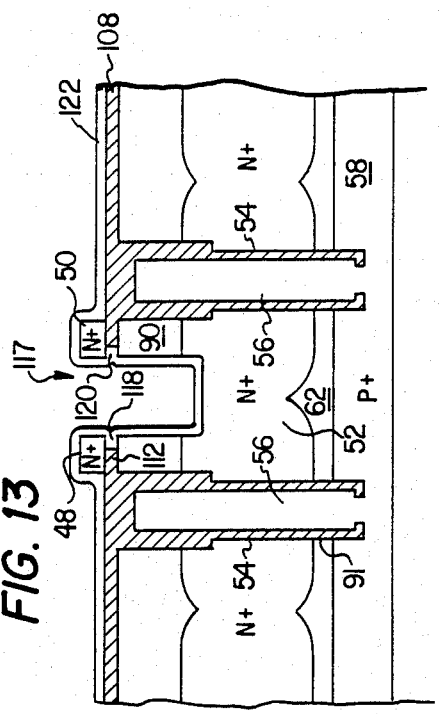

As shown in FIG. 10, the trench 91 is filled with a P+ polycrystalline silicon 98 which merges both with the P-type polysilicon 96 lining the sidewalls of the trench 91, as well as the P+ substrate 58. The polycrystalline silicon refill 98 defines the outer capacitor plate 56 circumscribing the dielectric 54. The entire trench lattice of the memory array is filled with the polysilicon 98, thus simultaneously forming all capacitor outer plates in common.

The P+ polysilicon layer 98 is deposited by conventional low pressure chemcial vapor deposition techniques, to a thickness sufficient to fill the trench 91. The surface of the wafer is then planarized by covering it with a photoresist layer 100 of the type having the same etch rate as that of the P+ polysilicon 98. As noted in FIG. 10, the photoresist 100 is not conformal, and thus covers the polysilicon 98 without forming surface cusps, such as exist in the conformal deposition of the polysilicon 98 in the trench 91. The wafer is etch, thus removing the entire layer of photoresist 100, the surface portion of the polysilicon 98 down in the trench to a point noted by the dotted line 102. The silicon dioxide 64 is not affected by etch, and thus remains essentially as it existed when deposited.

Figure 11:
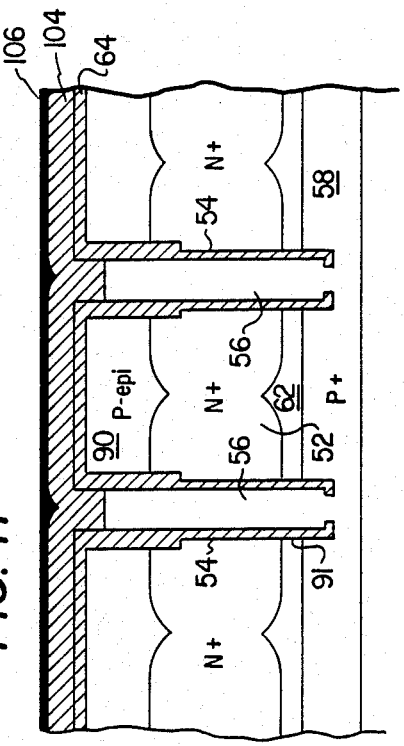

As noted in FIG. 11, a thick layer of silicon dioxide 104 is deposited over the surface of the wafer. A photoresist mask 106 is spread over the surface of the wafer to assist in the planarization of the wafer surface. As described above, planarization is accomplished by etching the photoresist layer 106 at the same rate as the silicon dioxide layer 104, until a desired depth is reached. However, in this planarization step, the etching process is continued until all of silicon dioxide 64 and 104 is removed. A controlled 500 angstrom layer 108 of thermal dioxide is grown on the wafer.

Figure 12:
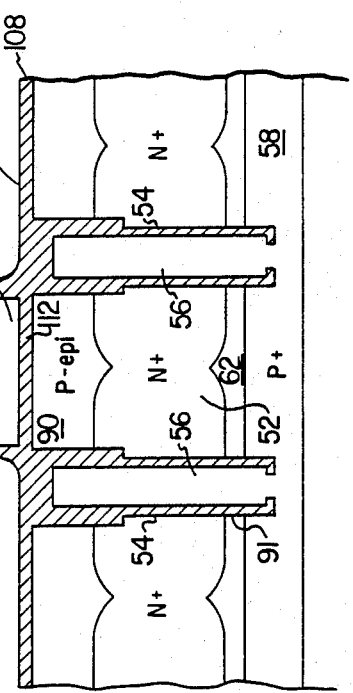

FIG. 12 illustrates the silicon dioxide layer 108 having a planarized top surface 110. The silicon dioxide 108 is homogeneous throughout the wafer, including the capacitor dielectric 54 and that portion 112 which overlies the transistor epitaxial substrate 90. Deposited on the silicon dioxide surface 110 is a thick layer 113 of doped conductive polysilicon. The polysilicon layer 113 is doped with an N-type impurity to provide a highly conductive layer of material which forms the basis of the bit line 36 (FIG. 2). The polysilicon layer 113 is masked and patterned to form the bit line 36 shown in FIG. 12. A layer of silicon dioxide 114 is then deposited over the surface of the wafer, and also masked and patterned by a photoresist layer (not shown) to form an opening 116 directly overlying the transistor epitaxial region 90. A portion of the bit line 36 is then etched downwardly, using the photoresist as a mask. The underlying silicon dioxide layer 112 is also etched. The P-type epitaxial transistor substrate 90 is also etched during the step, including a portion of the underlying N+ semiconductor region 52, as noted in FIG. 13.

A dry plasma etch process is utilized for etching the semiconductor material in the shape of the cavity 117.

The cavity 117 formed through the polysilicon bit line splits the bit line and forms the sections 48 and 50. A wet etch is utilized to laterally remove a portion of the silicon dioxide layer 112 and forms undercuts at areas noted by reference characters 118 and 120. The wet etch also removes the silicon dioxide layer 114 previously formed as the mask for etching the N+ semiconductor material forming the bit line strip 36. A conformal layer 122 of polycrystalline silicon is deposited over the surface of the wafer. The polycrystalline silicon layer 122 fills in the undercut areas 118 and 120, as well as the trench 91. Since the thickness of the oxide layer 112 is about 500 angstroms, the conformal layer 122 of polysilicon must be at least 250 angstroms thick in order to refill the undercut areas 118 and 120.

The wafer processed thus far according to the steps of the invention is subjected to a silicon oxidizing environment, such as in the presence of steam or oxygen at a temperature of about 1,000 degrees Celsius. The polysilicon oxidation converts the silicon material into a thin oxide layer 119. The oxide layer 199 is formed to a thickness of about 500 angstroms, and defines the transistor gate oxide 44. The elevated temperature of the wafer drives some of the dopant impurities from the N+ polycrystalline bit line sections 48 and 50 into the polysilicon material filling the undercuts 118 and 120. This is noted in FIG. 14 of the drawings. Indeed, a portion of the P-type epitaxial transistor substrate 90 is converted into an N-type material, thereby forming the cell transistor drain region 126. The transistor drain region 126 extends circumferentially around the thin gate oxide 44. As can be seen, the bit line segments 48 and 50 of the bit line strip 36 are in electrical continuity through the diffused polysilicon undercut regions 118 and 120 with the transistor drain region 126. Epitaxial substrate area 90 comprises the semiconductor material forming the transfer region of the transistor 30. As noted above, the underlying N+ region 52 forms the core plate of the capacitor 34, and also comprises the source region of the transistor 30.

A thick conformal layer 128 of heavily doped N+ polysilicon is deposited over the surface of the wafer, and patterned to form the word line 40. The N+ semiconductor material of the word line 40 fills the cavity 117 and forms the transistor gate conductor 42. The N+ gate conductor 42 is separated by the thin oxide 44 from the transfer region 90 of the memory cell transistor 30. The thin oxide layer 119 also affords electrical isolation between the intersecting bit line 36 and the word line 40. Various materials can be utilized as a passivating layer to cover the wafer and mechanically protect it from the environment.

Figure 14:
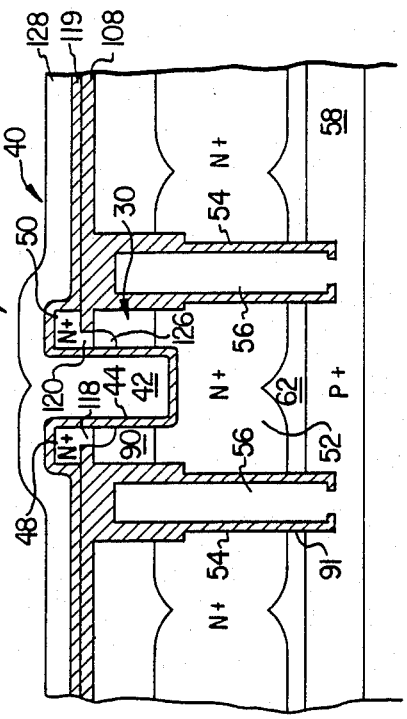

The vertical nature of the memory cell 14 of the invention is evident from FIG. 14, in that transistor drain region 126 overlies the source region 52, which also forms the capacitor core plate 52. The vertical area of the wafer, rather than lateral substrate space is utilized to fabricate the cell and conserve wafer area. As clearly illustrated in FIG. 14, the cell transistor 30 is nested within the capacitor dielectric 54, and is thus protected from free electrons or holes generated outside the cell. The same technical advantage is achieved with the capacitor core plate 52 which is more immune to the affects of alpha particles.

From the foregoing, an improved dynamic random access memory cell is disclosed having the technical advantage of a small area, high capacity storage cell. To conserve lateral wafer area, the bit lines and word lines are formed overlying the cell, and in contact with the transistor fabricated directly thereunder. The bit line strip split at an area overlying the transistor, and a cavity is formed therein so that the word line can be run therethrough to form the subsurface transistor gate conductor. The capacitor includes a core plate comprising a semiconductor region generally underlying the transistor. The capacitor plate is separated from the gate conductor by an oxide, which also forms the gate insulator of the transistor. The transistor channel is vertically oriented for providing a conduction channel between an overlying semiconductor source region and an underlying drain region.

The transistor source region is formed in an annular band surrounding the polysilicon gate conductor and insulator, and is located in a position underlying the split bit line. The out diffusion of impurities in the bit line into underlying polysilicon form the drain region of the transistor. The source region of the transistor is an unspecified semiconductor region which is continuous with the core plate of the capacitor. The semiconductor core plate of the capacitor is surrounded by a thin high-quality oxide, defining the dielectric for separating the capacitor core plate from an outer circumferential capacitor plate. The circumferential semiconductor capacitor plate comprises a polysilicon filled trench, doped with an impurity opposite that of the core plate. The outer capacitor plate is in electrical continuity with the substrate. Therefore, when the substrate is grounded, the circumferential capacitor plate is also at a ground potential and all cells are electrically isolated from each other.

It can be appreciated that with the vertical fabrication process of both the transistor and the capacitor, a memory cell is provided which is highly conservative of lateral wafer area. In addition, with a plug or core of semiconductor material forming one capacitor plate, and with a circumferential semiconductor area forming the other plate in common with yet other cell capacitors, a high capacitance storage element is provided.

While the preferred embodiment of the invention has been disclosed with reference to a specific example, it is to be understood that many changes in detail may be made as a matter of engineering choices without departing from the spirit and scope of the invention as defined by the appended claims.

What is claimed is:

1. A method of fabricating a semiconductor memory cell on a substrate, comprising the steps of:
   forming a layer of a semiconductor material of a first conductivity type on said substrate;
   forming an annular trench partially into said semiconductor material;
   forming a diffusion barrier on the top side walls of the said trench;
   diffusing an impurity of a second conductivity type into the exposed side walls of the said trench to thereby define a capacitor core plate in said semiconductor material;
   forming said trench deeper into the substrate;
   forming a thin insulation layer on the side walls of the trench to thereby form a capacitor dielectric;
   filling said trench with a semiconductor material of said first conductivity type to thereby form an outer capacitor plate;
   forming a cavity in said semiconductor material of said first conductivity type in a region overlying said capacitor core plate;

forming a thin insulating layer on the sidewalls and the bottom of said cavity to thereby define a gate insulator;

forming a semiconductor drain region in said semiconductor material around said gate insulator on an upper part thereof; and filling said cavity to provide a transistor gate conductor.

2. The method of claim 1 further including forming a doped semiconductor bit line overlying said transistor, and forming said source by driving the impurities of said bit line into the semiconductor material overlying said capacitor core plate.

3. The method of claim 1 further including forming a word line overlying line and insulated therefrom by insulation which is formed continuous with said gate insulator.

4. The method of claim 3 wherein said bit line has formed therein an opening in vertical registry with said cavity and said word line is formed through said opening into said cavity.

5. The method of claim 1 wherein said substrate and said semiconductor material are formed of the same conductivity type so that said outer capacitor plate is in electrical continuity with said substrate.

* * * * *